US012713564B2

(12) United States Patent
LeFebvre et al.

(10) Patent No.: US 12,713,564 B2
(45) **Date of Patent: *Aug. 18, 2026**

(54) HEAT REMOVAL SYSTEMS AND METHODS

(71) Applicants: Dale LeFebvre, Thomas, VI (US); Kenneth Choi, Santa Clara, CA (US)

(72) Inventors: Dale LeFebvre, Thomas, VI (US); Kenneth Choi, Santa Clara, CA (US)

( * ) Notice: Subject to any disclaimer, the term of this patent is extended or adjusted under 35 U.S.C. 154(b) by 345 days.

This patent is subject to a terminal disclaimer.

(21) Appl. No.: 18/303,429

(22) Filed: Apr. 19, 2023

(65) Prior Publication Data

US 2023/0255001 A1 Aug. 10, 2023

Related U.S. Application Data

(63) Continuation of application No. 16/850,869, filed on Apr. 16, 2020, now Pat. No. 11,659,693, which is a (Continued)

(51) Int. Cl.
*H05K 7/20* (2006.01)

(52) U.S. Cl.
CPC ..... *H05K 7/20745* (2013.01); *H05K 7/20827* (2013.01); *H05K 7/20836* (2013.01)

(58) Field of Classification Search
CPC ........... H05K 7/20745; H05K 7/20827; H05K 7/20836

(Continued)

(56) References Cited

U.S. PATENT DOCUMENTS 5,950,150 A 9/1999 Lloyd
8,593,815 B2 11/2013 Claassen et al.
(Continued)

FOREIGN PATENT DOCUMENTS

CN 104755850 7/2015
CN 106440167 A 2/2017
(Continued)

OTHER PUBLICATIONS

Office Action issued by the Japanese Patent Office (JPO) for Japanese Patent Application No. 2022-559577, mailed Feb. 19, 2025, 4 pages.

(Continued)

*Primary Examiner* — Avinash A Savani
*Assistant Examiner* — Dana K Tighe
(74) *Attorney, Agent, or Firm* — Sprinkle IP Law Group

(57) ABSTRACT

As air inside a building (e.g., a data center or any building that generates heat) becomes heated, it rises and is received or captured by a heat containment and then expelled from the building. The hot air is not recycled, recirculated, or re-cooled. Hot air being expelled from the building creates a pressure differential in which the pressure at the hot side of the building (where the heat containment is located) is lower than the cool side of the building. To this end, a chilling unit is installed at an opening of a building to supply cooled air at a constant rate. The chilling unit does not have an internal controller. Rather, an air conditioning (AC) unit of the building acts as an external controller. The AC unit is be set to maintain a target temperature and only runs when the temperature inside the building is above the target temperature.

20 Claims, 13 Drawing Sheets

Related U.S. Application Data continuation-in-part of application No. 16/230,799, filed on Dec. 21, 2018, now Pat. No. 10,667,436, which is a continuation of application No. 15/678,961, filed on Aug. 16, 2017, now Pat. No. 10,212,855, which is a continuation of application No. 14/984,149, filed on Dec. 30, 2015, now Pat. No. 9,769,960.

(60) Provisional application No. 62/098,176, filed on Dec. 30, 2014.

(58) Field of Classification Search
USPC .......................................................... 454/184
See application file for complete search history.

(56) References Cited

U.S. PATENT DOCUMENTS

| | | | | |
|---|---|---|---|---|
| 8,602,119 | B2 | 12/2013 | Wagner | |
| 9,313,929 | B1 | 4/2016 | Malone et al. | |
| 9,681,589 | B1 | 6/2017 | Ross et al. | |
| 9,737,740 | B2 | 8/2017 | Beresford | |
| 10,299,408 | B1 | 5/2019 | Lachapelle | |
| 10,398,065 | B2 | 8/2019 | Karrat et al. | |
| 10,612,801 | B1 * | 4/2020 | Czamara | H05K 7/1485 |
| 11,376,454 | B2 | 7/2022 | Bogart | |
| 12,199,259 | B1 | 1/2025 | Cao | |
| 12,396,138 | B2 | 8/2025 | LeFebvre et al. | |
| 12,513,863 | B2 | 12/2025 | LeFebvre | |
| 2002/0070035 | A1 | 6/2002 | Grabow | |
| 2007/0103325 | A1 | 5/2007 | Wagner | |
| 2007/0169947 | A1 | 7/2007 | Love | |
| 2008/0105443 | A1 | 5/2008 | Molz | |
| 2009/0014187 | A1 | 1/2009 | Wagner | |
| 2009/0038811 | A1 | 2/2009 | Wagner | |
| 2009/0321039 | A1 * | 12/2009 | Therrien | H05K 7/2059 700/275 |
| 2010/0154448 | A1 | 6/2010 | Hay | |
| 2012/0073840 | A1 | 3/2012 | Prieur | |
| 2013/0277071 | A1 | 10/2013 | Schaefer | |
| 2014/0020673 | A1 | 1/2014 | Zank | |
| 2014/0027132 | A1 | 1/2014 | Oosterhuis | |
| 2014/0124224 | A1 | 5/2014 | Berghuijs | |
| 2015/0053430 | A1 | 2/2015 | Beresforf | |
| 2015/0323411 | A1 | 11/2015 | Eberlein | |
| 2017/0135408 | A1 | 5/2017 | Cameron | |
| 2017/0372578 | A1 | 12/2017 | Klein et al. | |
| 2018/0227141 | A1 | 8/2018 | Zribi | |
| 2018/0352683 | A1 | 12/2018 | Karrat et al. | |
| 2019/0118016 | A1 | 4/2019 | Severijns | |
| 2020/0054905 | A1 | 2/2020 | Livchak et al. | |
| 2021/0197000 | A1 | 7/2021 | Kypbida | |
| 2025/0194055 | A1 | 6/2025 | LeFebvre et al. | |
| 2026/0059715 | A1 | 2/2026 | LeFebvre | |

FOREIGN PATENT DOCUMENTS

| | | | |
|---|---|---|---|
| CN | 107409478 | A | 11/2017 |
| CN | 108141990 | A | 6/2018 |
| EP | 2648496 | | 5/2019 |
| JP | 2012098799 | A | 5/2012 |
| JP | 2012-533123 | | 12/2012 |
| JP | 2014-089695 | | 5/2014 |
| JP | 2018-509675 | | 4/2018 |
| WO | WO2016/109653 | | 7/2016 |

OTHER PUBLICATIONS

Examination Report issued by the European Patent Office for European Patent Application No. 21787919.6, mailed Mar. 13, 2025, 6 pages.
Examination Report issued by the African Regional Intellectual Property Organization (ARIPO) for ARIPO Application No. AP/P/2024/015456, mailed Mar. 25, 2025, 5 pages.
Office Action issued by the U.S. Patent and Trademark Office (USPTO) for U.S. Appl. No. 19/048,800, mailed Apr. 4, 2025, 14 pages.
Office Action issued by the U.S. Patent and Trademark Office (USPTO) for U.S. Appl. No. 17/892,683, mailed Feb. 24, 2025, 7 pages.
International Preliminary Report on Patentability (IPRP) issued by the International Bureau of WIPO for PCT Application No. PCT/US2023/072654, mailed Mar. 6, 2025, 12 pages.
International Search Report and Written Opinion issued by the U.S. Patent and Trademark Office as the International Searching Authority (USPTO/ISA) for International Application No. PCT/US23/72654, mailed Jan. 19, 2024, 13 pages.
Extended Search Report issued by the European Patent Office for European Patent Application No. 21787919.6, mailed Apr. 16, 2024, 10 pages.
Office Action issued by the Chinese Patent Office for Chinese Patent Application No. 202180021709.8, mailed Apr. 24, 2025, 20 pages.
Office Action issued for U.S. Appl. No. 19/048,800, mailed Apr. 30, 2025, 10 pages.
Notice of Allowance issued by the U.S. Patent and Trademark Office (USPTO) for U.S. Appl. No. 17/892,683, mailed May 7, 2025, 14 pages.
Office Action issued by the U.S. Patent and Trademark Office (USPTO) for U.S. Appl. No. 17/892,683, mailed Jun. 10, 2025, 6 pages.
Notice of Allowance issued by the U.S. Patent and Trademark Office (USPTO) for U.S. Appl. No. 17/892,683, mailed Jul. 10, 2025, 13 pages.
Notice of Allowance issued by the U.S. Patent and Trademark Office (USPTO) for U.S. Appl. No. 19/048,800, mailed Aug. 12, 2025, 14 pages.
Office Action and English translation issued by the Chinese Patent Office for Chinese Patent Application No. 202180021709.8, mailed Oct. 15, 2025, 13 pages.
Examination Report with English translation issued by the Thai Patent Office for Application No. 1701003635, dated Dec. 24, 2025, 27 pages.
Office Action and English translation issued by the Chinese Patent Office for Chinese Patent Application No. 202180021709.8, mailed Dec. 26, 2025, 15 pages.
Examination Report with English translation for Patent Application No. 202217060449, Intellectual Property India, Government of India, Feb. 9, 2026, 8 pgs.
Examination Report for European Patent Application No. 20185009.6, mailed Feb. 12, 2026, 3 pgs.
Office Action with English translation for Indonesia Patent Application No. P00202209848, dated Mar. 17, 2026, 6 pages.
Office Action with English translation for Brazilian Patent Application No. BR112022019302-5, dated May 20, 2026, 5 pages.

* cited by examiner

HEAT REMOVAL SYSTEMS AND METHODS

CROSS-REFERENCE TO RELATED APPLICATIONS

This is a continuation of, and claims a benefit of priority under 35 U.S.C. § 120 from, U.S. patent application Ser. No. 16/850,869, filed Apr. 16, 2020, issued as U.S. Pat. No. 11,659,693, entitled "HEAT REMOVAL SYSTEMS AND METHODS," which is a continuation-in-part of, and claims a benefit of priority from, U.S. patent application Ser. No. 16/230,799, filed Dec. 21, 2018, issued as U.S. Pat. No. 10,667,436, entitled "HEAT REMOVAL SYSTEMS AND METHODS," which is a continuation of, and claims a benefit of priority from, U.S. patent application Ser. No. 15/678,961, filed Aug. 16, 2017, issued as U.S. Pat. No. 10,212,855, entitled "DATA CENTER HEAT REMOVAL SYSTEMS AND METHODS," which is a continuation of, and claims a benefit of priority from, U.S. patent application Ser. No. 14/984,149, filed Dec. 30, 2015, issued U.S. Pat. No. 9,769,960, entitled "DATA CENTER HEAT REMOVAL SYSTEMS AND METHODS," which is a conversion of, and claims a benefit of priority under 35 U.S.C. § 119 (e) from, Provisional Application No. 62/098,176, filed Dec. 30, 2014, entitled "DATA CENTER HEAT REMOVAL SYSTEMS AND METHODS," all of which are fully incorporated by reference herein for all purposes.

COPYRIGHT NOTICE

A portion of the disclosure of this patent document contains material which is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

TECHNICAL FIELD

This disclosure relates generally to data centers. More particularly, this disclosure relates to new, improved systems and methods for cooling data center servers and removal of heat from data centers.

BACKGROUND

A data center is a facility used to house computer systems and associated components such as air conditioning systems. Large scale data centers can include hundreds of servers and can require as much energy as a small town to power the data center computer equipment and cooling equipment.

As such, energy usage consumed by data centers is a major cost consideration. Energy costs in data centers arise from computing, networking activities, and power transformations that use energy and, as a byproduct, generate heat. However, a majority of energy costs is associated with the removal of heat from the data center. Active heat management equipment (i.e., air conditioning systems) is substantially less than 100% efficient, which means heat monitoring and management equipment adds to the data center heat removal problems because they generate heat through their own operation.

In a conventional data center environment, desired temperatures are maintained using heating, ventilation, and air conditioning (HVAC). Typically, the ambient temperature is monitored by a thermostat, which turns the heat or air conditioning on and off to maintain the temperature set by the thermostat.

SUMMARY OF THE DISCLOSURE

Embodiments provide systems and methods to allow a combination of active and passive thermal data center processes for removing heat from data center environments having computing equipment, networking equipment, and/or power distribution systems.

In some embodiments, a data center heat removal system may include an adjustable thermal feed cold air intake system, a distribution system for cold and warm air including one or more hot aisles and one or more cold aisles, and a convection system to draw cool air through data center equipment using naturally-occurring convection processes to expel hot air. That is, some embodiments utilize passive pressure differences to expel hot air and bring in cool air, either alone or in combination with active use of fans or other air circulation devices. In addition, some embodiments may use heat exchangers.

In some embodiments, these components are interchangeable and modular and are the basis of a novel solution that provides an efficient method of removing heat from a data center.

Embodiments utilize natural convection for heat removal from a data center including using the pressure differential between a hot aisle and a cold aisle. Embodiments may also use cold air from misters and/or freezer boxes for the intake of cold air. Some embodiments may use a natural process to form two distinct pressure regions in the data center. Some embodiments may use natural processes to maximize the air pressure differential between the cold aisle input of an individual server and its output to the warm aisle. Some embodiments allow natural process-driven multi-stage air cooling.

Advantageously, embodiments efficiently manage the climate (which can include temperature, humidity, air flow, and air quality, etc.) within a data center and minimize the use for energy for air distribution. Some embodiments minimize the use of active heat management equipment that generates heat through their own operation. Some embodiments minimize and eliminate the use of moving cooling parts. Some embodiments minimize maintenance costs associated with server heating and cooling. Some embodiments manage the costs of computing services.

In some embodiments, a system for data center heat removal includes an adjustable pressure feed cold air intake system; one or more heat exchangers; a distribution system for cold and warm air (cool aisles and warm aisles); and a convection system to draw cool air through data center equipment along with embedded server fans. The system further may make use of naturally-occurring convection processes to expel hot air, thus creating a relative vacuum to draw in cool air (and may optimally use an adjustable fan for disposing of warm air). Thus, embodiments may include a sealed warm low pressure area and a cold pressure area.

Although the examples herein are described in the context of data centers, some embodiments disclosed herein can be adapted or otherwise implemented to work in other types of environments, circumstances, etc. Some embodiments may automatically utilize convection for cooling. Some embodiments are designed to allow multi-stage cooling. Some embodiments utilize pressure to expel hot air and draw in cool air. Some embodiments can be built into a new building. Some embodiments can be retrofitted to remove heat from and provide cool air to an existing building or environment. Some embodiments can be particularly useful for high volume applications. Numerous additional embodiments are also possible.

For instance, in some embodiments, a method for removing heat from and cooling air in a building (e.g., a data center or any industrial building that generates heat) can include positioning an exhaust end of a chilling unit in an opening of the building (e.g., in a wall, roof, or ceiling of the building), the chilling unit having a housing having the intake end and the exhaust end and at least one fan positioned in the housing and set to operate at a constant speed (whether the at least one fan is a fixed speed fan or a variable speed fan) to draw ambient air from the intake end of the housing, cool the ambient air, and direct the cooled air to the opening of the building. The method can further include capturing or receiving hot air inside the building through a heat containment inside the building; setting an air conditioning unit inside the building to maintain a target temperature; and expelling the hot air from the building through an exhaust structure of the building. In some embodiments, the target temperature can be a minimum service temperature required by an owner or operator of the building. The air conditioning unit can be any existing or commercially available HVAC system.

Expelling the hot air from the building creates a pressure differential in which an air pressure at a hot side of the building is lower than an air pressure at a cool side of the building. This pressure differential draws the cooled air supplied by the chilling unit through the opening of the building from the hot side of the building to the cool side of the building. Responsive to a temperature in the building rising above the target temperature and with the chilling unit supplying the cooled air to the building at a constant rate, the air conditioning unit is operable to run until the temperature in the building drops down at or below the target temperature. In this way, the chilling unit can significantly reduce the energy consumption of the air conditioning unit.

In some embodiments, the heat containment can be implemented in a server pod enclosing one or more banks of servers. The server pod can have openings for drawing in the cooled air and a vent for directing air heated by the one or more banks of servers to the exhaust structure. In some embodiments, the heat containment can further include a sealed hood, enclosure, ductwork, or pipe.

In some embodiments, the chilling unit can further include at least a filter, an evaporative cooler, an evaporative cooling element, a freezer coil, or a chiller to further cool the air drawn in from the intake end of the housing.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features.

DETAILED DESCRIPTION

Figure 1:
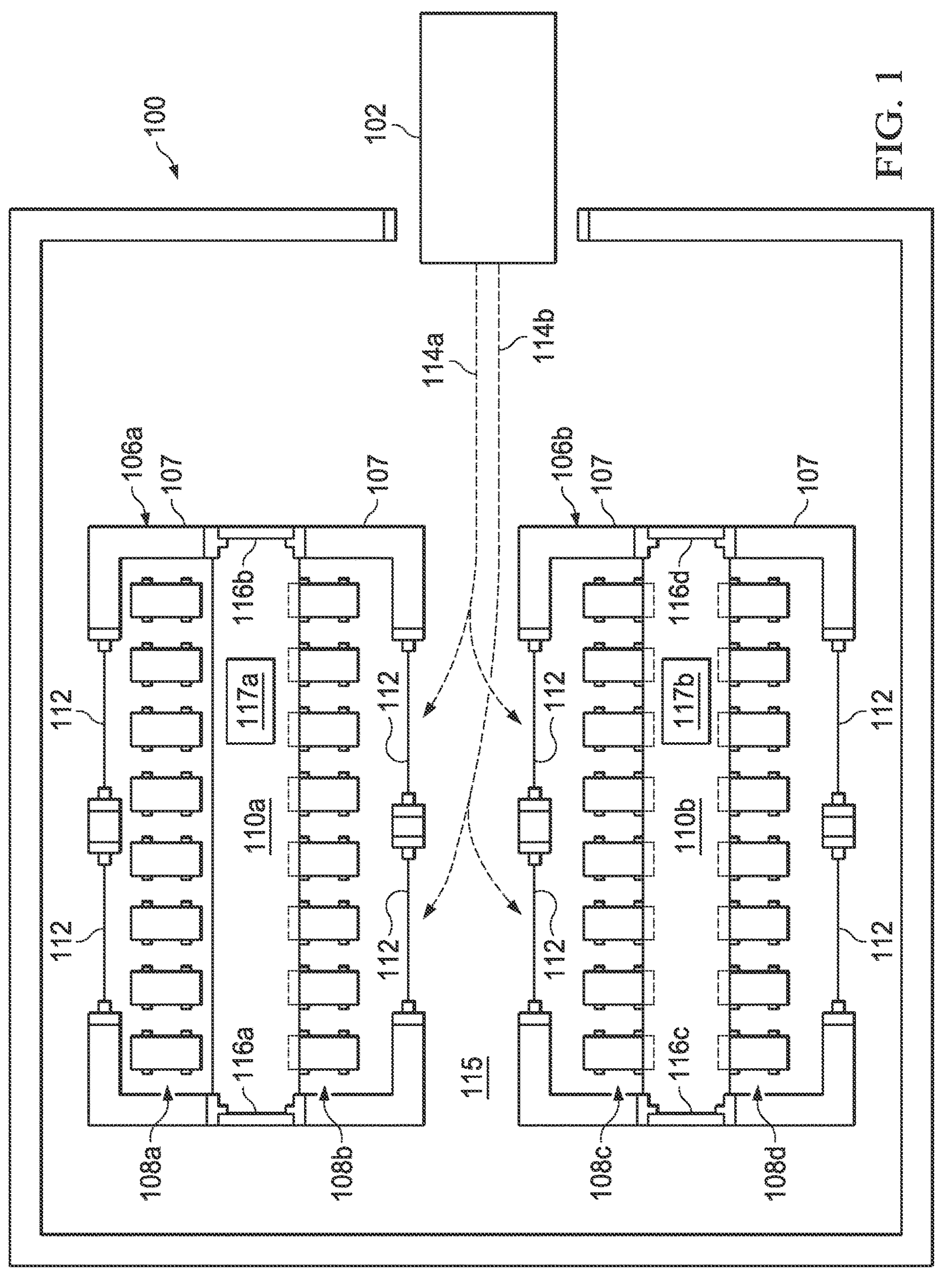
FIG. 1 depicts a diagram illustrating an exemplary data center heat removal system configured for a data center and having a chilling unit according to some embodiments.

Following is a description of one exemplary data center environment in which a heat removal system may be implemented according to some embodiments. FIG. 1 depicts a diagram schematically illustrating a layout of a data center heat removal system according to some embodiments. In the example of FIG. 1, a data center heat removal system for a data center 100 includes a chilling unit 102. As will be described in greater detail below, the chilling unit 102 may include a housing, one or more fans or similar devices configured for drawing in air from outside the data center, one or more misters for cooling the air, and one or more chiller units for further reducing the air temperature.

The data center 100 may include one or more server pods 106*a* and 106*b*. The server pods 106*a* and 106*b* may be embodied as self-contained rooms or enclosures that have walls 107, doors 116*a*, 116*b*, 116*c*, 116*d*, and ceilings (not shown). The server pods 106*a* and 106*b* are configured to house one or more banks of servers 108*a*, 108*b* and 108*c*, and 108*d*, respectively. The server banks 108*a*, 108*b* and 108*c*, and 108*d* may comprise racks of servers mounted on above each other. It is noted that while two server pods are illustrated, in practice, a data center may employ many more. Thus, the figures are by way of example only.

The server pods 106*a* and 106*b* include openings 112 for drawing in cool air from the chilling unit 102 via one or more "cold aisles" 115. Additional cold aisles may be formed between other server pods, in the example where the data center includes numerous server pods. The server pods 106*a* and 106*b* may further be configured such that banks of servers 108*a* and 108*b* (and similarly, server banks 108*c* and 108*d*) are separated by a "hot aisle" 110*a* and 110*b*, respectively. In operation, cold air is drawn in from the cold aisle(s) 115 and flows across the server banks 108*a* and 108*b* (and similarly, server banks 108*c* and 108*d*), where the air is heated by the servers. The heated air, isolated in the hot aisles 110*a* and 110*b*, is then drawn up and out through vents 117*a* and 117*b* in the ceiling of the respective pods 106*a* and 106*b*. The heated air escaping from the hot aisles 110*a* and 110*b* will yield lower pressure in the hot aisles 110*a* and 110*b*, causing cool air to be drawn from the cold aisle(s) 115. The air circulation can be controlled by varying the volume of air allowed through the supply side or through the exhaust side or both (described in detail below).

Accordingly, air heated by the server banks 108*a*, 108*b* and 108*c*, and 108*d* will rise to the top of the pods 106*a* and 106*b* via natural convection and be vented through vents 117*a* and 117*b*. Some embodiments provide a sealed hood for the hot air flows (see e.g., the hood 211 shown in FIG. 2). In some embodiments, additional fans may be provided in or in conjunction with the vents 117*a* and 117*b* to assist in drawing out the heated air and/or to maintain a desired pressure differential.

As illustrated by the exemplary flow lines in FIG. 1 (represented by lines 114*a* and 114*b*), air flows from the chilling unit 102 into one or more cold aisles 115, from which they are drawn into the server pods 106*a* and 106*b* via openings 112. Inside the server pods 106*a* and 106*b*, internal fans of the servers (not shown) may draw the air across the servers and out into the hot aisles 110*a* and 110*b*. From the hot aisles 110*a* and 110*b*, the heated air is vented through the vents 117*a* and 117*b*.

In some embodiments, the vents 117*a* and 117*b* may be provided with or associated with fans that draw air up into them. In some embodiments, the fans are coupled to or controlled by one or more pressure sensors, which can be utilized to ensure that the pressure in the hot aisles 110*a* and 110*b* is lower than the pressure in the cold aisles 115. For example, if the pressure in the hot aisle 110*a* or 110*b* is detected as being the same or higher than the pressure in the cold aisle 115, the respective fans may be operated at a higher speed to draw more air in the hot aisles 110*a* and 110*b* up for venting through the vents 117*a* and 117*b*. This ensures that a desired pressure differential, and/or a desired air flow rate, can be maintained or otherwise controlled.

Figure 2:
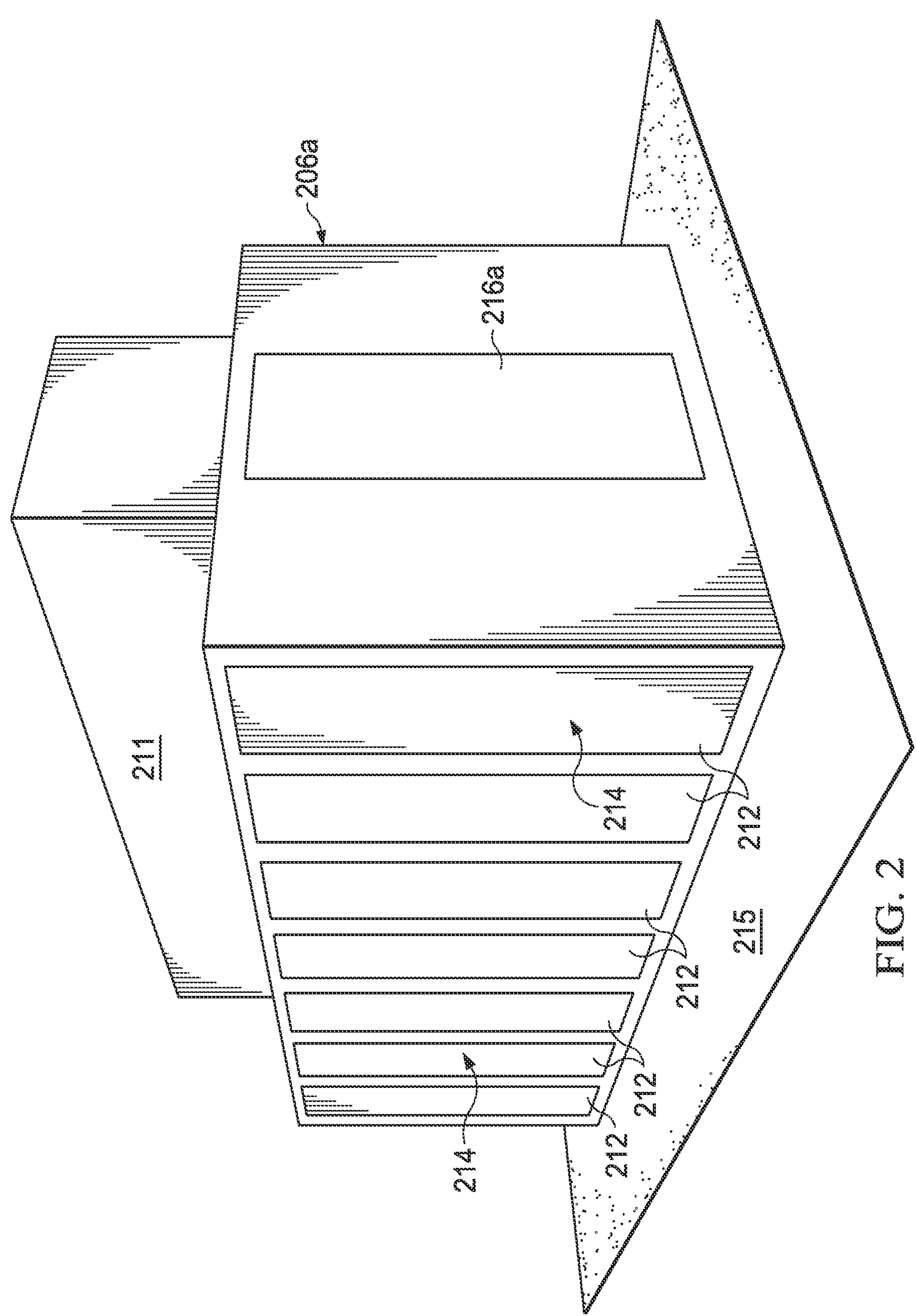
FIG. 2 is a perspective view of an exemplary server pod of a data center implementing an exemplary data center heat removal system disclosed herein.

FIG. 2 is a perspective view illustrating an exemplary server pod of a data center that houses a plurality of server banks (now shown). For clarity, only one server pod is shown. The data center of FIG. 2 may be an embodiment of the data center 100 shown in FIG. 1. In this example, a server pod 206*a* and an adjacent server pod (not shown) are separated by cold aisle 215. The sides of the server pod 206*a* include screened openings 212 for admitting cool air into the server pods 206*a*. As illustrated, the server pod 206*a* includes an access door 216*a* defining an opening to the hot aisle (not shown) inside the server pod 206*a*. In the example illustrated, the server pod hot aisle (inside the server pod 206*a*) extends from the ceiling of the server pod 206*a* to the ceiling of the data center via an enclosure or hood 211. The cold aisle 215 is pressurized with cool air which is then drawn through the racks of the server pod 206*a*, as illustrated by arrows 214. The air is then drawn out the top of the server pod 206*a* via the enclosed or sealed hood 211.

Figure 3:
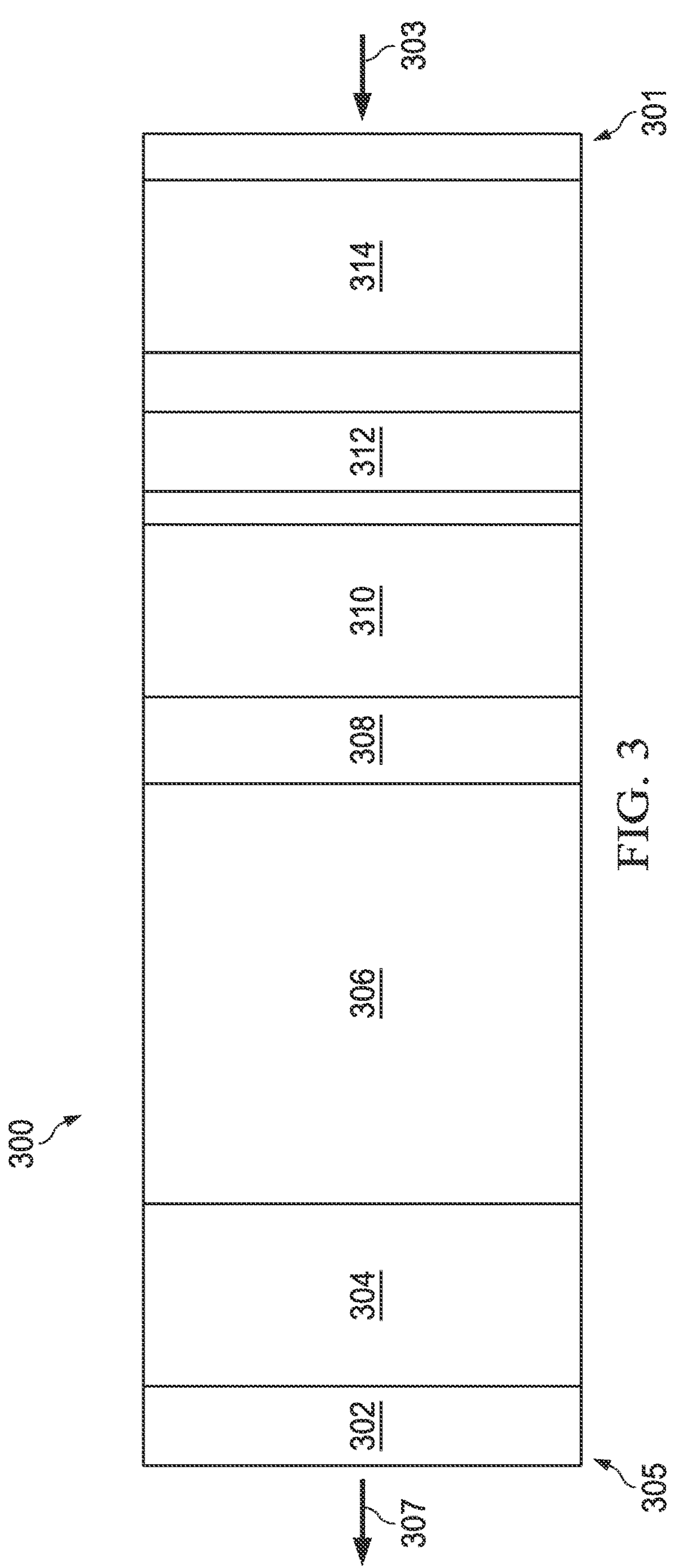
FIG. 3 is a block diagram of an exemplary arrangement of a chilling unit according to some embodiments.

As described above with respect to FIG. 1, a data center heat removal system may include one or more chilling units, such as the chilling unit 102. FIG. 3 is a block diagram of one exemplary arrangement of a chilling unit 300, which may be used in a data center according to some embodiments. The chilling unit 300 may include a structure or housing for housing the various components of the chilling unit, described below. In one example, a housing may comprise a shipping container housing, being approximately 20 feet long, 7'10" tall, and 7'8" wide according to one non-limiting example. Other types and sizes may also be used.

In the exemplary chilling unit 300 shown in FIG. 3, the direction of air flow through the chilling unit 300 is shown by the arrows at each end of the chilling unit 300. Ambient air enters the chilling unit 300 at a first end 301 (as shown by the arrow 303) and exits at a second end 305 into the data center (as shown by the arrow 307). In the example illustrated in FIG. 3, the chilling unit 300 includes a first fan unit 314, a first filter 312, a second fan unit 310, a mister 308, a chiller unit 306, a third fan unit 304, and a second mister 302. In some embodiments, each of the components may be configured to extend across a cross section of the container. Further, in some embodiments, one or more of the components may not be necessary. For example, in some embodiments, the chiller unit 306 may not be required by a data center heat removal system disclosed herein (e.g., the data center 100 shown in FIG. 1) where the air outside a data center configured with the data center heat removal system is usually at a sufficiently cool temperature (e.g., depending upon the climate, location, and/or altitude at which the data center is located) that artificial cooling may not be necessary. Furthermore, in some embodiments, the humidity of the air may be such that only one mister is needed.

In some embodiments, the number and configuration of fan units in the chilling unit 300 may be chosen based on air flow requirements, as desired. In some embodiments, the fan units 314, 310, and 304 may each include four 44" drum fans capable of moving approximately 72,000 CFM of air. The control of the fan units is described in detail below. The filter units 312 may be implemented as four-stage Hepa filters in some embodiments.

In some embodiments, the chiller unit 306 may be configured to include chillers on both sides of the chilling unit 300, with coils that extend to meet each other at 45 degrees from the sides. In some embodiments, the coil units may be hinged such that, when not in use, they can swing to the sides of the chilling unit using motors.

In some embodiments of a data center heat removal system, various types of sensors can be placed in a data center to sense various conditions in the data center. In some embodiments, the sensed conditions are stored in a database and are used by a control system to control the operation of the components of the chilling unit and associated fans, vents, etc. (described below). The control system may be associated with the chilling unit 300 or the data center itself, or both. The sensors may include temperature sensors, humidity sensors, air flow sensors, pressure sensors, and/or other types of environmental sensors. In some embodiments, each chilling unit 300 may provide up to 60,000 CFM of air to the data center at or under 78 degrees. In other embodiments, each chill unit 300 may provide more or less capacity, as desired.

While the chilling unit 300 is pressurizing the data center, the variable speed ceiling fans (e.g., for the vents 117*a* and 117*b* of FIG. 1 or the hood 211 of FIG. 2) of the data center may be adjusted to keep the pressure in the hot aisles at lower than the cool side of the system. When the temperature is below a threshold value (e.g., 65 degrees), one of the fans may be slowed or shut off to decrease the pressure and the ceiling fan will slow to reduce amount of air that is being released.

Figure 4:
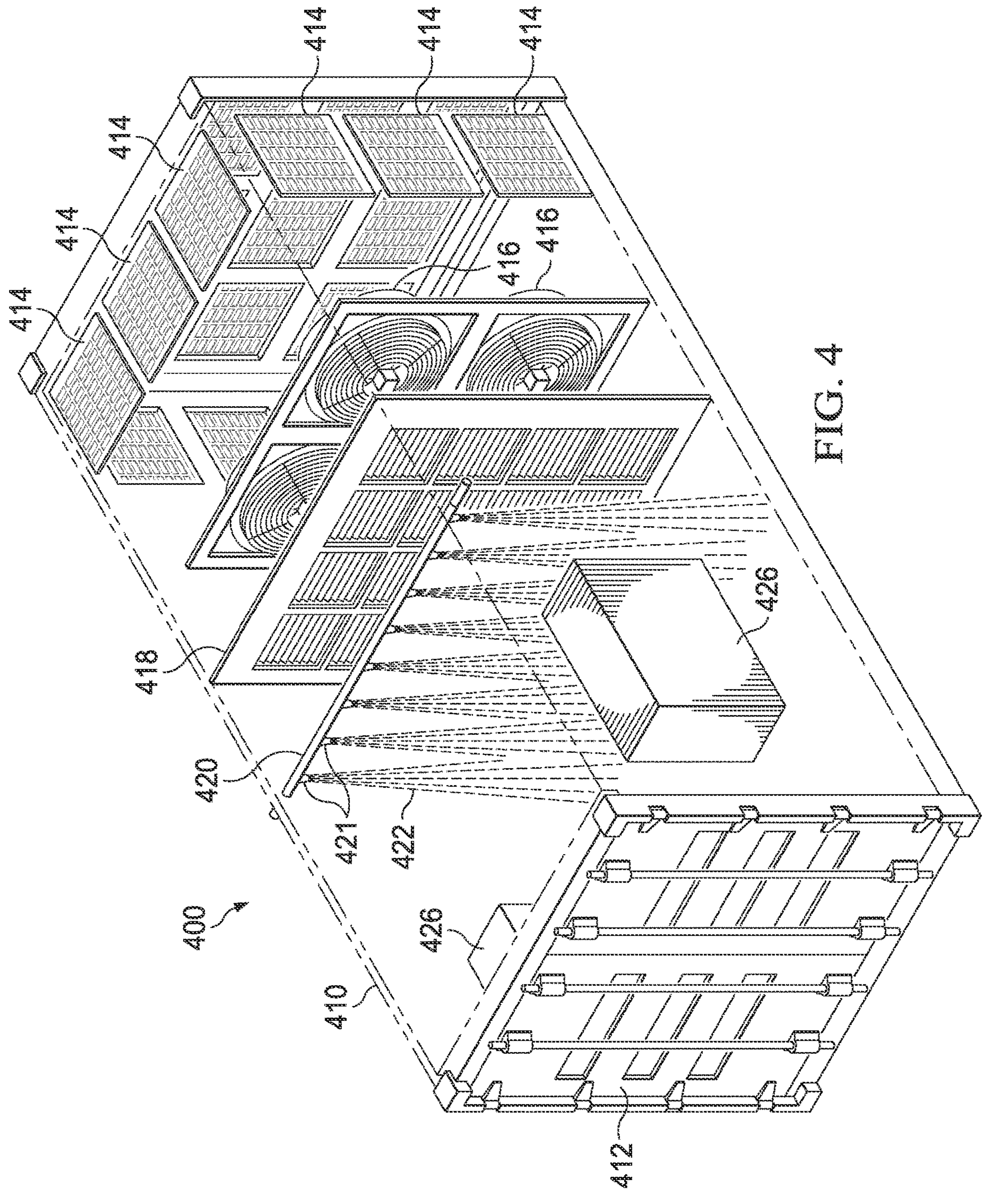
FIGS. 4-7 are views of an exemplary chilling unit according to some embodiments.
Figure 5A:
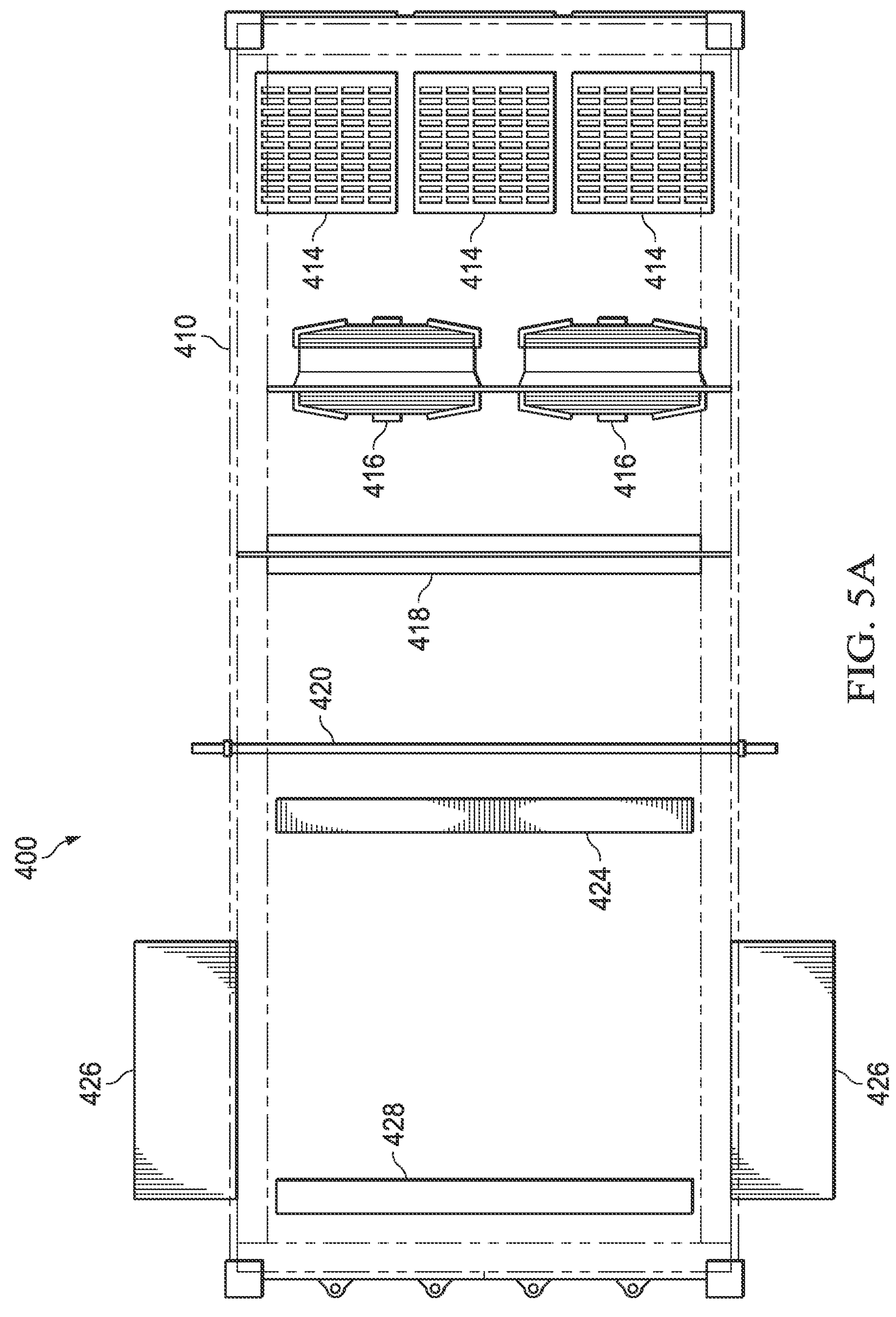
Figure 5B:
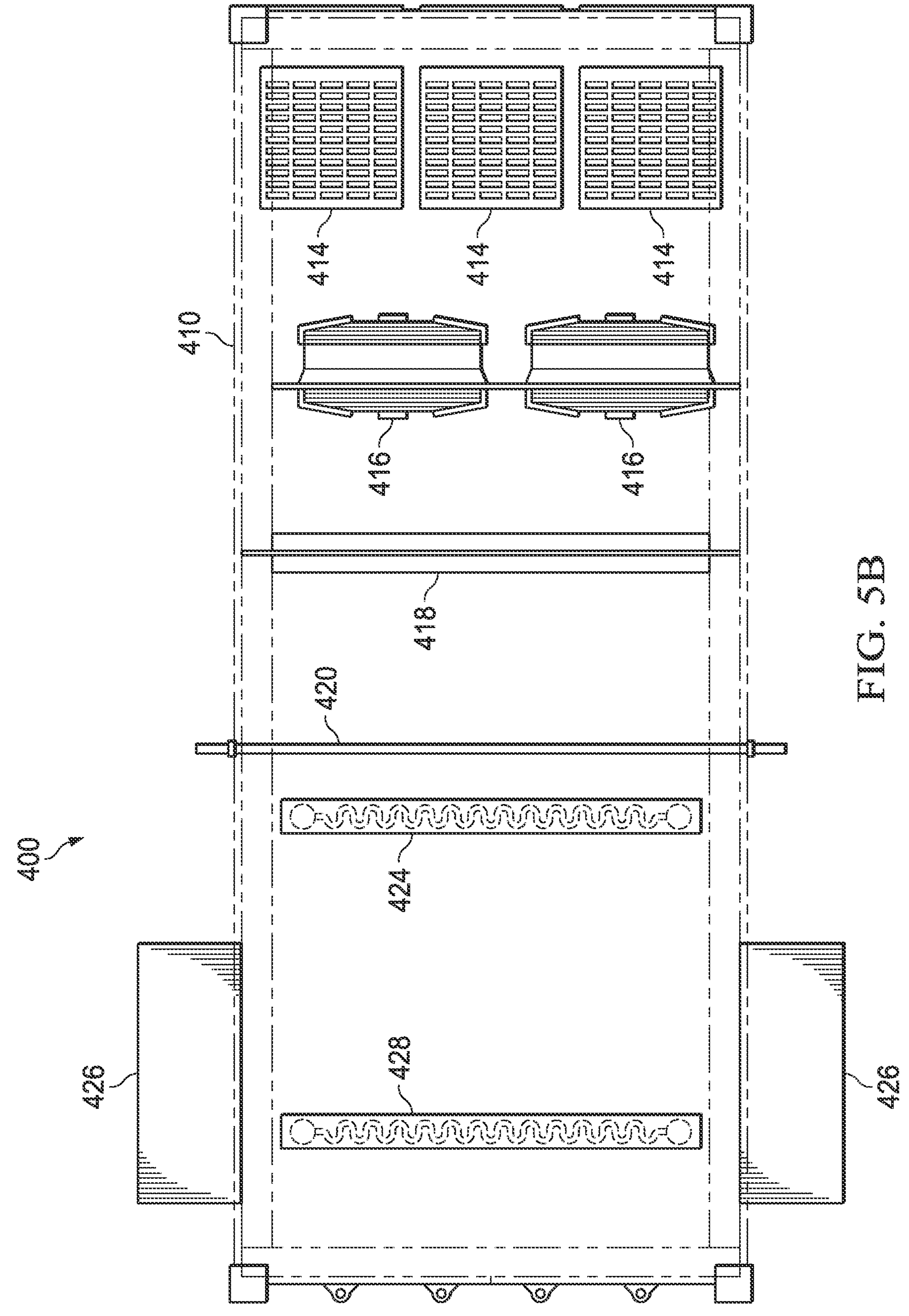
Figure 5C:
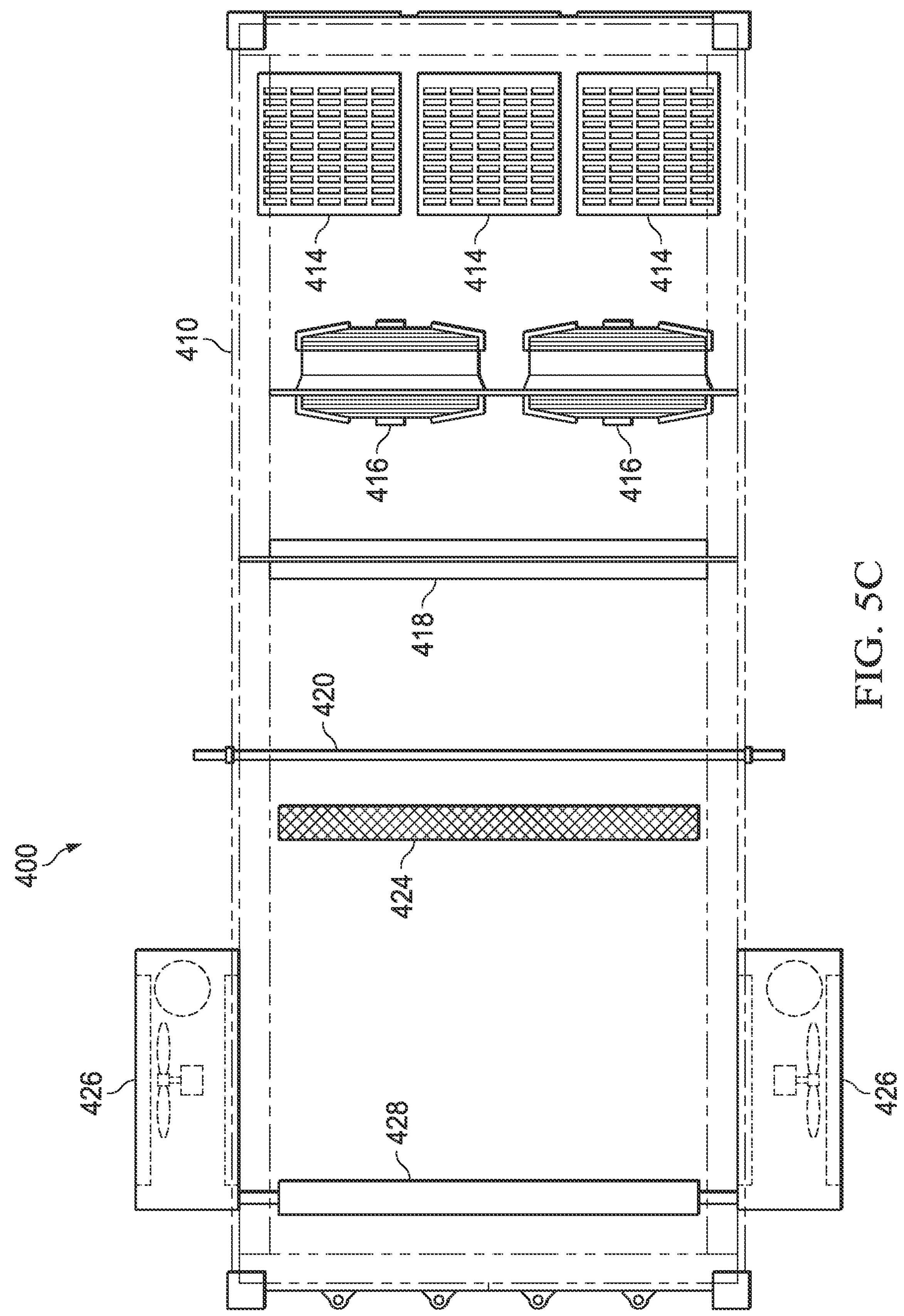
Figure 6:
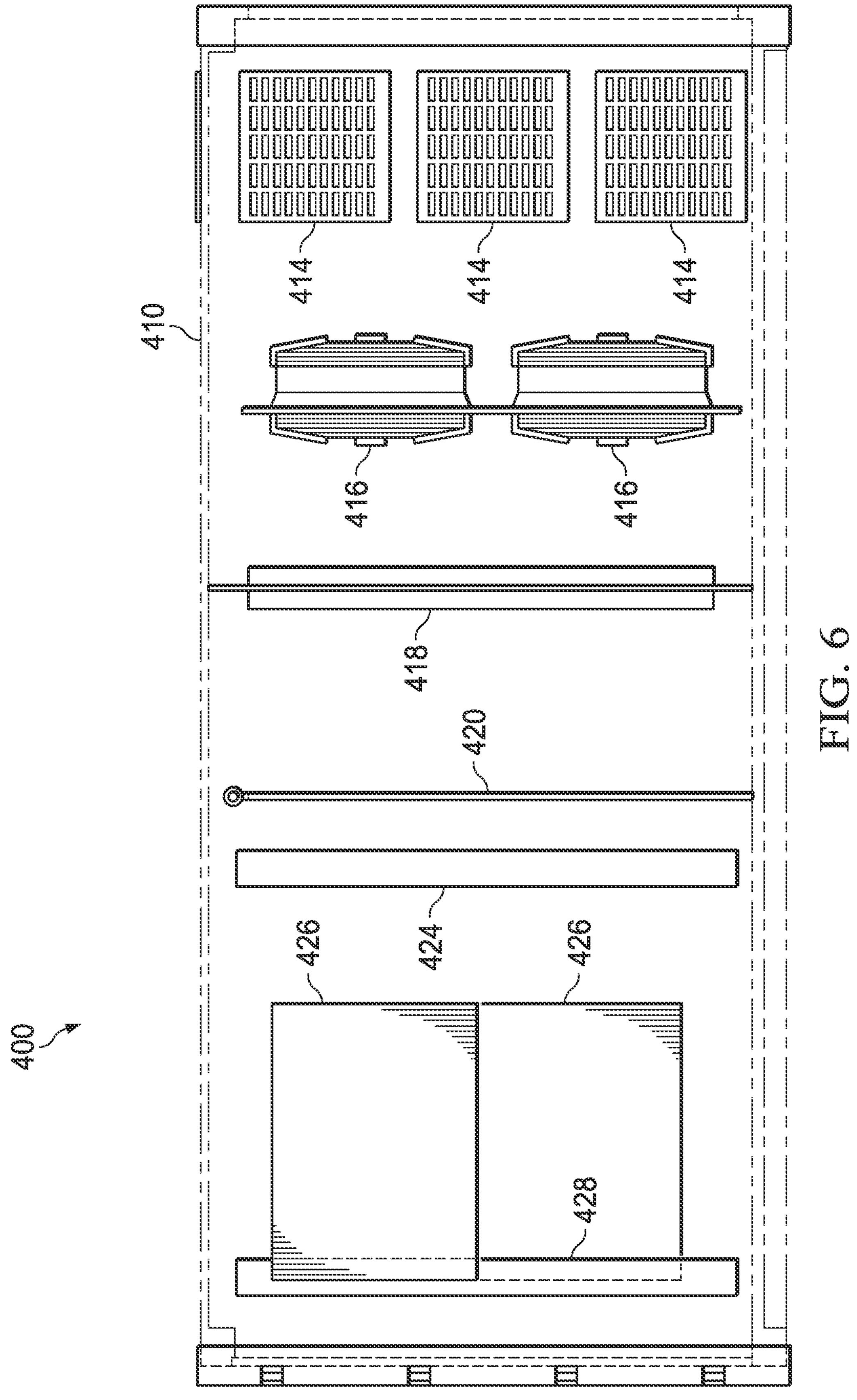
Figure 7:
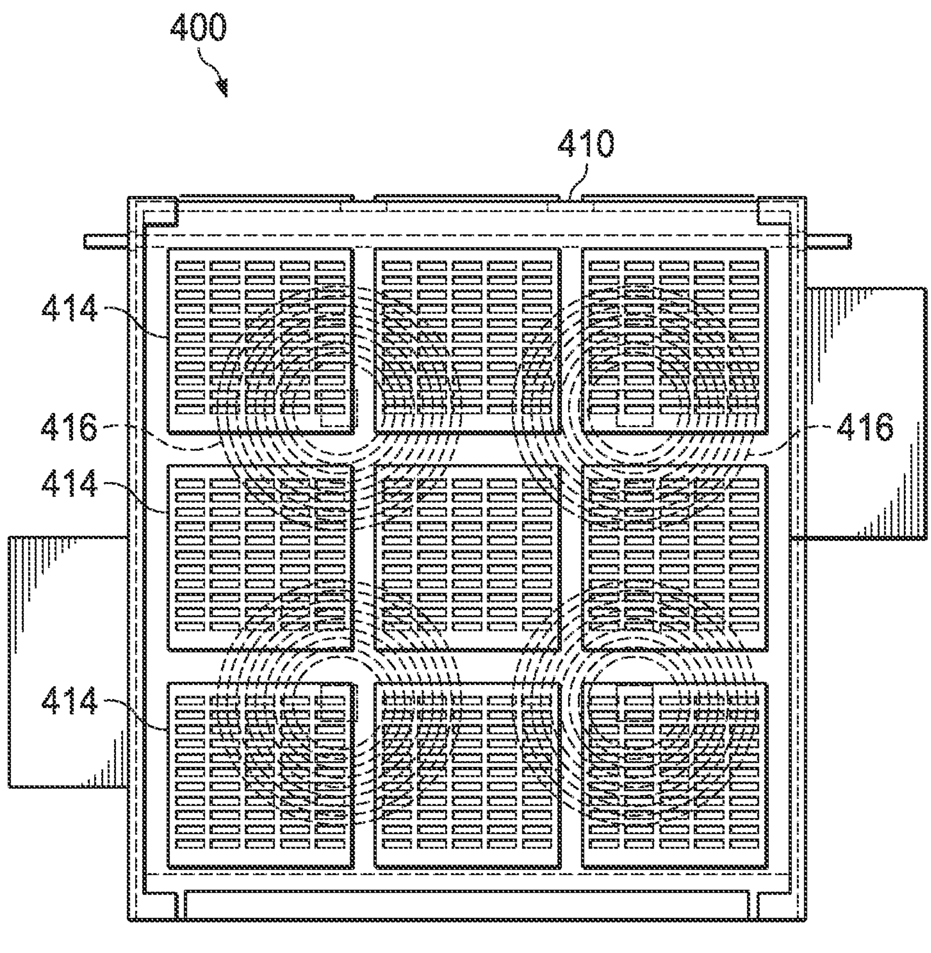

FIGS. 4-7 are views of an exemplary chilling unit according to some embodiments. Other configurations and layouts are also possible. In FIGS. 4-7, the housing walls are hidden to show the chilling unit components inside the housing. FIG. 4 is an isometric view of a chilling unit. Each of FIG. 5A, FIG. 5B, and FIG. 5C is a top view of the chilling unit shown in FIG. 4. FIG. 6 is a side view of the chilling unit shown in FIG. 4. FIG. 7 is an end view of the chilling unit shown in FIG. 4.

As mentioned above, in some embodiments, a chilling unit can be housed using a standard shipping container. A typical shipping container is comprised of a steel box having doors at one end. Although a standard shipping container works well as a chilling unit housing, a customized housing can also be used. In one example, a standard 20 foot freezer shipping container is used. In this example, an intake area (described below) is formed at one end of the container.

As shown in FIGS. 4-7, a chilling unit 400 includes a housing 410 having doors 412 at one end. During use of the chilling unit 400, the doors 412 are opened, or completely removed. In FIGS. 4-6, the direction of air flow through the chilling unit 400 is from right to left.

At the right end of the chilling unit 400 are a plurality of vents 414 that form openings in the housing 410 to allow air to be drawn into the chilling unit 400 from outside. In the example shown in FIG. 4, the vents 414 are formed on the end, and on 3 sides of the housing 410. Downstream from the vents 414 are one or more fans 416. In the example shown in FIGS. 4-7, four fans are arranged to substantially cover the cross-sectional area of the housing 410. More or fewer fans could be used. As described in more detail below, the fans 416 may be single or variable speed, and may be controlled together or independently. The fans 416 draw air into the chilling unit 400 via the vents 414, and force the air through filter(s) 418. In one example, the fans 416 are 42 inch drum fans, each capable of moving 18,200 cubic feet per minute (CFM) of air. In the example of FIGS. 4-7, four fans are placed in the intake side. In other examples (e.g., FIG. 3), four more fans are placed on the exhaust end of the housing 410. In one example, the filters are 3-stage heap filters angled at 45 degrees from both sides to provide more surface area.

Downstream from the filters 418 is a mister 420. In the example shown, the mister 420 comprises a series of mister nozzles 421 near the top of the housing 410 pointing downward. When the mister 420 is activated, a fine mist 422 of water is sprayed downward as the air flows through the chilling unit 400. Depending on the temperature and relative humidity, the mister 420 can lower the temperature of the air by approximately 10 degrees.

Downstream from the mister 420 are mister cooling elements 424. For clarity, the mister cooling elements 424 are not shown in FIG. 4, but are shown in FIGS. 5A-6. The mister cooling elements 424 are made of a metal material and help to cool the air even further by providing a surface for mist condensation. As the air flows through the mister cooling elements 424, the air is not only cooled by evaporating mist, but also by passing through the mister cooling elements 424. The mister cooling elements 424 can be any configuration that allows air to flow through, while providing a surface (e.g., a metal surface) for mist condensation. Examples of the mister cooling elements 424 can include coils, a metal grate or mesh, etc., as one skilled in the art would understand.

Downstream from the mister 420 and the mister cooling elements 424 are a pair of chillers 426 mounted on opposite walls of the housing 410. The chillers 426 can be conventional off-the-shelf air-conditioning or freezer units configured to chill the air. If the air needs to be further cooled, one or more of the chillers 426 can be turned on. FIGS. 5A-6 also show freezer elements such as freezer coils 428 disposed within the housing 410 between the chillers 426. The freezer elements 428 are extensions of piping from the chillers 426 extending into the chiller unit 400 to improve heat transfer with the air. In one example, the freezer elements 428 are configured to extend out at a 45 degree angle from the sides of the housing 410. In one example, the freezer elements 428 are movable to automatically swing back against the interior wall of the housing 410 when not in use.

Note that the configuration of a chilling unit can take on many configurations, as desired. For example, the chilling unit 300 shown in FIG. 3 has three sets of fans and two sets of misters. Depending on various factors, such as local climate, data center size, cost limitations, etc., a chilling unit can be configured in such a way as to balance desired performance and cost.

Figure 8:
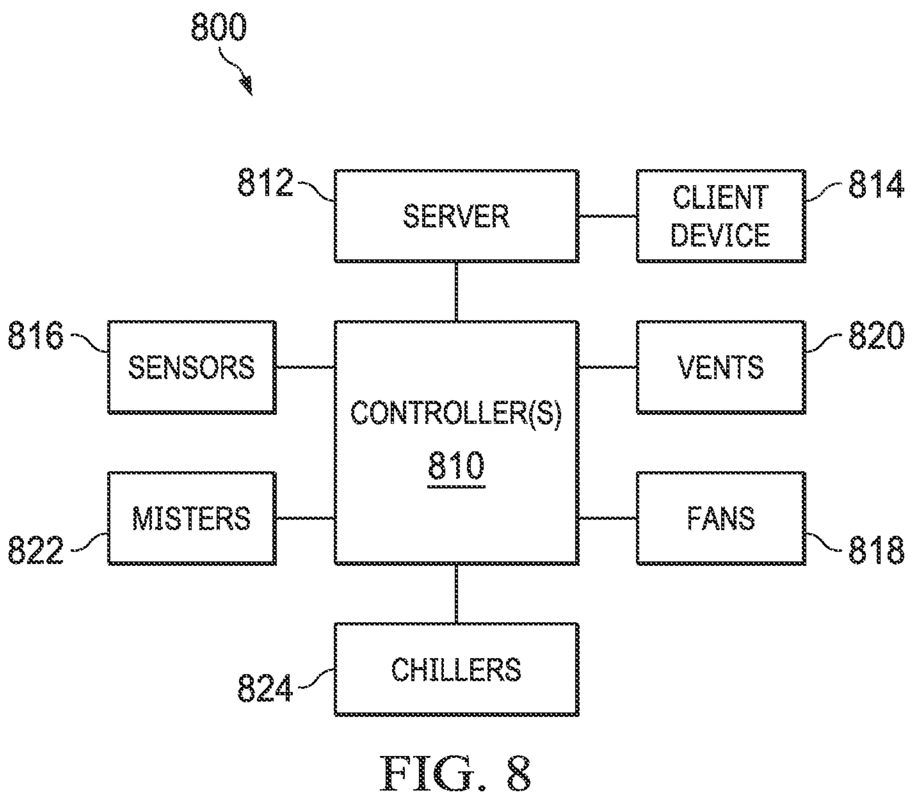
FIG. 8 is a block diagram illustrating an exemplary data center heat removal system configured to maintain a desired temperature in a data center according to some embodiments.

As mentioned above, the temperature of a data center can be controlled and maintained by sensing various conditions in the data center and controlling various components of a system accordingly. FIG. 8 is a block diagram illustrating a system 800 that is configured to maintain a desired data center temperature in the most energy efficient manner possible. The system 800 has a controller 810 capable of interfacing and controlling the various components of the system 800. The controller 810 may be comprised of a single device that interfaces with the components of the system 800, or may include multiple devices working together. For example, a data center may have separate fan controllers, chiller controllers, etc. In one example, a web-based application runs on a server 812 and controls the operation of the controller 810. One or more client devices 814 can be used by a technician to configure and monitor the controller via the web-based application.

The system 800 uses a plurality of sensors 816 to sense various conditions in the data center. The sensors may include temperature sensors, humidity sensors, air flow sensors, and/or pressure sensors, and any other desired sensors. The temperature sensors may sense the temperature in the hot isles, cold isles, server pods, chilling units, exhaust vents, individual servers, etc. The ambient temperature can also be sensed outdoors or at the intake portion of the chilling unit. Similarly, humidity sensors can also sense the humidity anywhere in the data center, as desired. Pressure sensors sense air pressure at various places in the data center. By monitoring the air pressure throughout the data center, a desired air flow through the system can be maintained. In one example, the air pressure is sensed in the cold isles, hot isles, and exhaust vents. The system 800 may also use any other type of sensor desired.

The system 800 controls the operation of the fans 818 of the system to maintain a desired air flow throughout the system. For example, a data center may have fans in the chilling units (e.g., fans 416 in FIG. 4) and in the exhaust vents (e.g., vents 117*a* and 117*b* in FIG. 1). The controller 810 controls whether the fans are on or off, as well as controlling their speed, when variable speed fans are used. The controller 810 is capable of determining how to most efficiently use the fans to maintain a desired air flow, and thus temperature. For example, if a given amount of air flow is needed to maintain a target temperature, the controller can selectively activate individual fans, and control them at desired speed(s) to achieve a desired airflow using the least amount of electricity possible.

The system 800 can also control the opening and closing of vents 820 in the system, if the system is equipped with closable vents. For example, the intake vents of the chilling units may include louvers that can be opened and closed by the controller 810. Similarly, the exhaust vents can be opened and closed by the controller 810. The vents 820 can not only be opened and closed, but can be opened a desired amount, to further control the amount of air flow through the vents 820.

The system 800 also controls the operation of the misters 822 (e.g., misters 420 in FIG. 4) of the system to lower the air temperature in the system. As described above, activating the misters 822 can, under the right conditions, lower the air temperature by approximately 10 degrees. The misters 822 have the most effect in low-humidity conditions. By knowing the humidity of the air, the controller 810 can determine when activating the misters 822 will have a beneficial effect.

The system 800 also controls the operation of the chiller units 824 (e.g., chillers 426 in FIG. 4) of the system to lower the air temperature. By activating the chiller units 824, the air temperature can be significantly lowered to help achieve a desired air temperature.

The controller 810 may also control various other components, as desired. In addition, the controller 810 and web-based application can monitor, log, and report various aspects of the operation of the system 800. The system 800 may include monitors, visual indicators, alarms, etc., either via client devices or standalone indicators and devices, to allow users or technicians to monitor the operation of the system 800.

The system 800 is controlled to achieve a desired target temperature in the server pods in the most efficient manner possible. The dominate factor that determines the cost of cooling a data center of electricity usage. The various components of the system 800 that contribute to lowering air temperatures each use different amounts of electricity. Therefore, the controller 810 is configured to achieve and maintain a target temperature by controlling the system components in such a way that electricity usage is minimized.

A goal of the controller is to maintain a desired target temperature, using the least possible amount of electricity. When the chiller units may use significantly more power than the fans and misters, the controller will try to maintain the desired target temperature without using the chiller units, or at least minimizing the use of the chiller units. Similarly, the controller will selectively activate and control the speed of the fans to achieve a desired airflow using the least amount of power.

In one example, the controller 810 uses an algorithm to control the system. The algorithm may, when possible, maintain a desired target temperature without using the chiller units 824. For example, under the right conditions, the desired target temperature can be maintained by controlling the activation and speed of the fans 818 alone. Under the right conditions (e.g., a relatively low humidity level), the misters 822 may be used with the fans. Use of the misters 822 may allow fans usage to be reduced, further lowering power usage.

The control algorithm, via the sensors, knows the conditions (e.g., temperature, humidity, air pressure differentials) in the system, and can control the system accordingly. For example, assume that an X degree temperature drop is needed. Knowing the outside ambient air temperature, the various temperatures in the system, and the relative air pressures in the system, the controller can determine that Y cubic feet of air flow is needed to reach the desired target temperature. The controller then selectively activates and controls the speed of the fans in the system to achieve the determined air flow rate. The controller also takes into account how activation of the misters will affect the air temperature, and thus the desired air flow rate. When the sensed conditions indicate that use of the misters would be beneficial, the misters will be activated. As a result, the controller can maintain the desired target temperature using a combination of fans and the misters in the most efficient way possible, preferably without relying on the chiller units. If the outside ambient temperature is high enough (perhaps 78 degrees, in one example), the desired target temperature may not be achievable with fans and mister alone. When that is the case, the controller will turn on one or more of the chiller units to bring the air temperature down to the desired target level.

Figure 9:
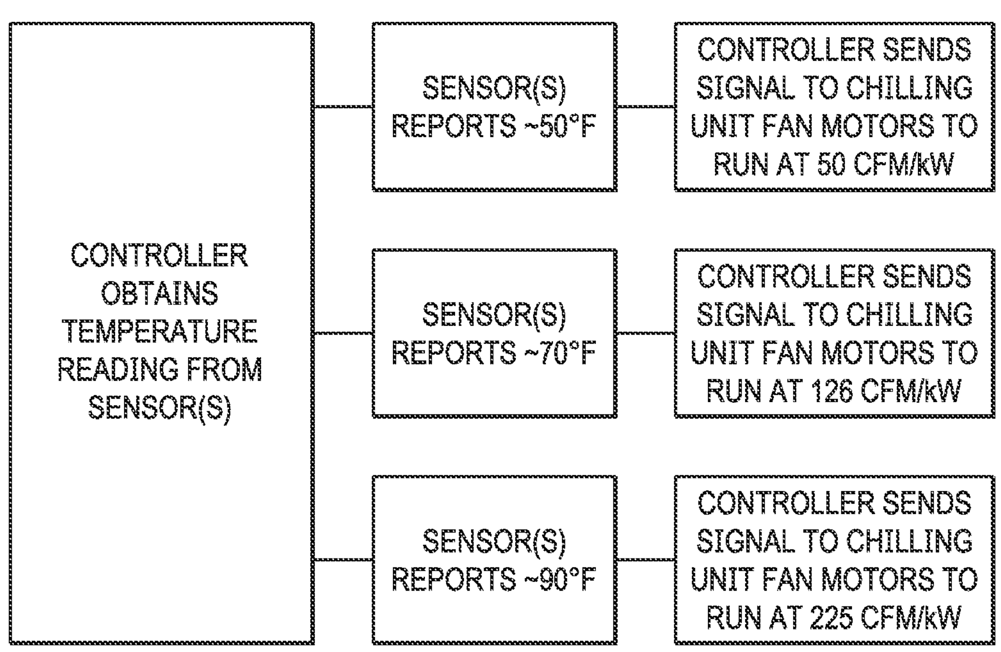
FIG. 9 is a logical control diagram for an exemplary data center heat removal system according to some embodiments.

FIG. 9 is a logical control diagram illustrating an example of the control of the fans (e.g., fans 416 in FIG. 4) in a chilling unit/data center based on a sensed condition(s). In the example illustrated in FIG. 9, the controller controls the amount of air flow through the system based on, for example, the temperature of the air at the intake of the chilling unit. In general, cooler air requires less air flow to cool the data center, while warmer air requires more air flow to cool the data center.

As shown in FIG. 9, the controller obtains a temperature reading from one or more temperature sensors. The temperature sensor(s) may be located at the intake of the chilling unit, outside of the chilling unit, or at any other suitable location. In this example, if the sensor reports an air temperature of approximately 50 degrees Fahrenheit, the controller sends a digital signal to the fans to run at 50 CFM/KW. As indicated by the air flow rate values in FIG. 9, the desired flow rate also depends on the amount of power being consumed in the data center, in this example, 50 CFM/KW. In other words, when more power is being consumed by the data center, more heat is generated, and therefore, more air flow is needed. The desired flow rate can be achieved by selectively activating fans, as well as setting the speed of the activated fans. In some examples, the air flow rate may be fine-tuned by also controlling exhaust fans. If the sensor reports an air temperature of approximately 70 degrees Fahrenheit, the controller sends a digital signal to the chilling unit fans to run at 126 CFM/KW. If the sensor reports an air temperature of approximately 90 degrees Fahrenheit, the controller sends a digital signal to the chilling unit fans to run at 225 CFM/KW.

Other components of the system (e.g., misters, coolers, etc.) can be controlled in a similar manner based on any desired sensed conditions, as one skilled in the art would understand. Also note that the activation of different components of the system may affect each other. For example, if the misters are activated, a lower air flow rate may be desired, compared to a desired air flow rate without the misters.

Note that it is important to not only lower the temperature of a data center to a desired level, but to not let the temperature drop too far below the desired level. The reliability of some server equipment relies on a relatively constant temperature. Therefore, in some conditions (e.g., winter months), the outside ambient air will be cool enough that the controller will restrict air flow to keep the air temperature up to the desired target value.

The systems described above can be built into a new data center or retrofitted into an existing data center utilizing existing structures such as ducting, chimney(s), etc. In an example where a system is retrofitted into an existing data center, one or more chilling units can each be installed in an opening formed in a data center wall, as illustrated in FIG. 1. In each hot isle, an exhaust vent/hood (e.g., vents **117*a*** and 117*b* in FIG. 1) is created to draw hot air out of the data center. A controller and various sensors (e.g., temperature, humidity, and/or pressure, etc.) can also be installed to monitor and control the operation of the system.

A distinction between the system described above and a conventional cooling system is that the system disclosed herein does not recycle or re-cool air in a building. A conventional cooling system that recycles and/or re-cools air in a building can be characterized as a "closed-loop" system in that the indoor air circulates, or mostly circulates, in a closed loop. Such a system assumes that it is more energy efficient to cool already air inside the building. A conventional cooling system such as an HVAC system may be required (depending upon the climate zone where the HVAC system is located) to use an economizer to draw outdoor air into a building and use dampers to control the amount of air pulled in, recirculated, and exhausted from the building. The use of such an economizer can reduce the time that the AC is running, which reduces the HVAC energy consumption. However, the outdoor air has to be below a set temperature and the humidity has to be lower than a set percentage. That is, economizers do not work well where the outdoor air is moist and warm. In such places, economizer cooling is not required because the potential energy savings may not be sufficient to justify the additional cost of implementing it.

To this end, in some embodiments, the chilling unit described above can be modified to work in conjunction with an air conditioning (AC) unit. However, unlike a conventional HVAC system, air heated in a building is not recycled, recirculated, or re-cooled. Rather, the hot air is expelled or otherwise exhausted from the building (which can be any industrial building such as a data center, a manufacturing plant, etc. that produces heat).

In this case, the building is structured so that it has a heat containment. The structure of this heat containment can vary from implementation to implementation, depending upon building designs. In the example of FIG. 2, the heat containment is structured as a pod (e.g., the server pod 206*a*) with a sealed hood or enclosure (e.g., hood 211) which directs the hot air (which is heated by the server banks (e.g., the server banks 108*a*, 108*b* and 108*c*, and 108*d*) inside the pod and risen to the top of the pods 206*a* via natural convection) to flow to a vent or exhaust opening of the building. Additionally or alternative, a heat containment can include ductwork (which refers to a system of ducts) and/or pipes (e.g., for directing the hot air with or without the sealed hood to the exhaust opening). Other implementations are also possible.

Exhausting the hot air from the heat containment creates a relative vacuum in the building. In some embodiments, a chilling unit disclosed herein can supply cooled air to the building as described above. However, the fan(s) and/or similar device(s) configured to draw ambient air from the intake end of the chilling unit are set to operate at a constant speed. The chilling unit may or may not include a mister or an evaporative cooler. Because the fan(s) and/or similar device(s) in the chilling unit are set to operate at a constant speed, there is no need for a controller to vary their speed. Thus, in such embodiments, the chilling unit does not need a customer controller. Rather, an AC in the building can function as a controller for the heat removal system to maintain a desired target temperature in the building. The AC unit can be set to a certain temperature so that it only operates when it senses that the temperature in the building is above that set temperature. In this way, the chilling unit can, while not replacing the AC unit, reduce the energy consumption of the AC unit.

Figure 10A:
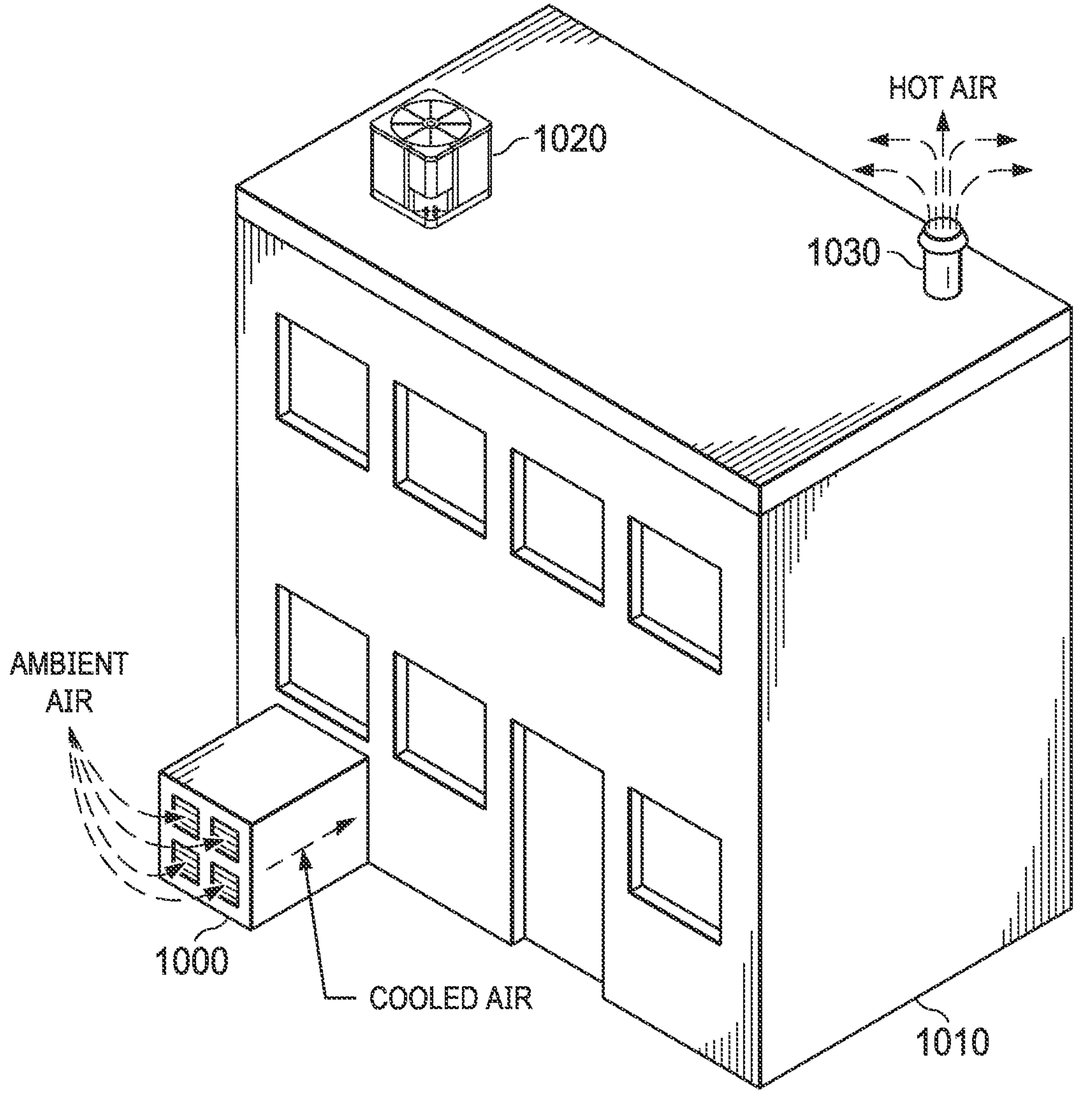
FIG. 10A depicts a building installed with an example of a heat removal system disclosed herein according to some embodiments.
Figure 10B:
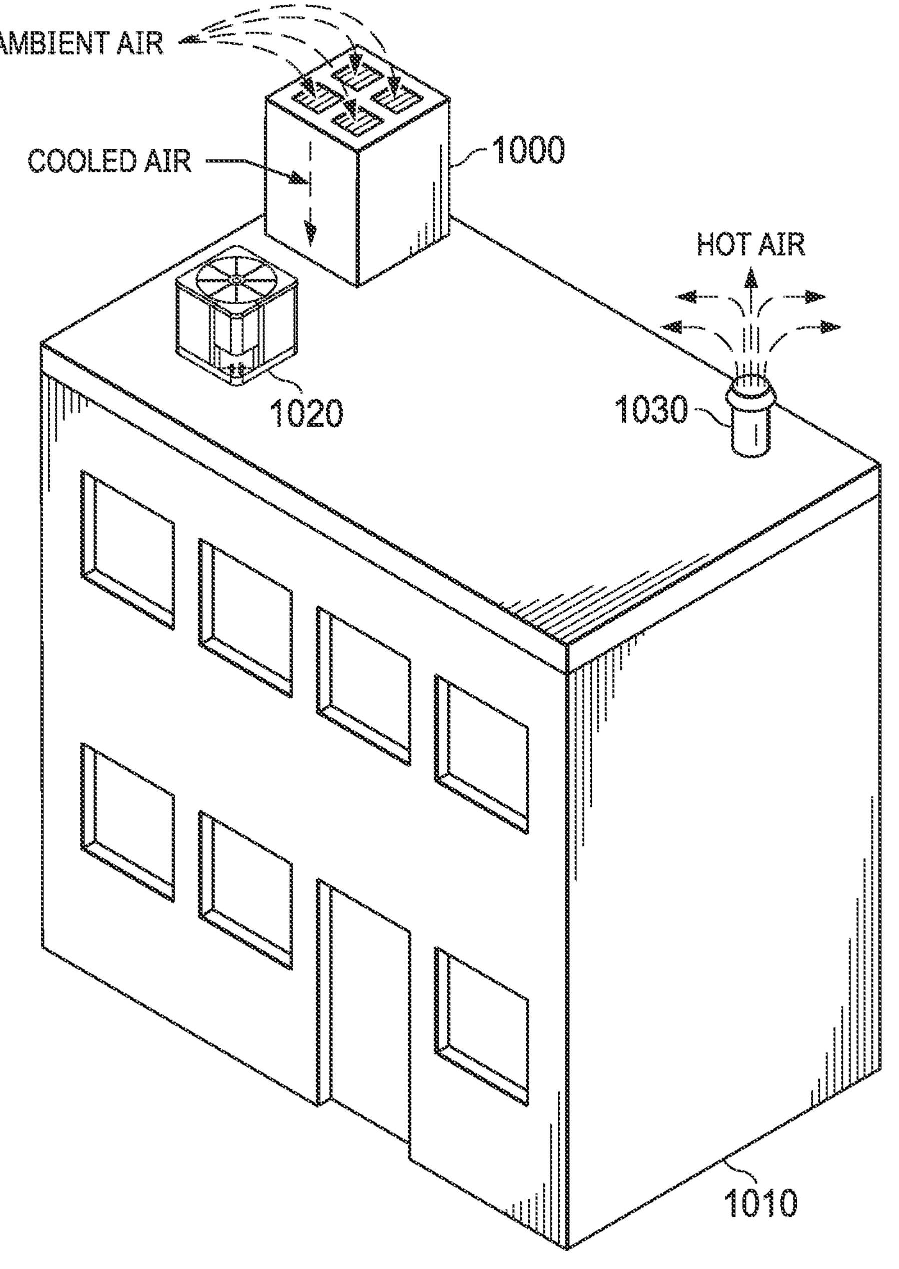
FIG. 10B depicts a building installed with another example of a heat removal system disclosed herein according to some embodiments.

This heat removal system, which includes a chilling unit and an AC unit, can be implemented in many ways. FIG. 10A shows an example in which a chilling unit 1000 is positioned or installed in an opening formed in a wall of a building 1010. As illustrated in FIG. 10A, contained hot air is expelled from the building 1010 through a vent or exhaust structure 1030. This creates a pressure differential between the hot side (e.g., the heat containment in the building) and the cool side (e.g., the intake side of the building) of the building. To this end, the chilling unit 1000 draws ambient air from its intake end and supplies cooled air through its exhaust end to the intake of the building 1010. The building 1010 has an HVAC system 1020 which is set to maintain a minimum service temperature of the building. The fan(s) and/or similar device(s) in the chilling unit 1000 are set to operate at a set speed so that the HVAC system 1020 will only come on when the ambient air is at a temperature that is above the minimum service temperature of the building. In this example, both the HVAC system 1020 and the vent or exhaust structure 1030 are installed on the top of the building 1010. However, the HVAC system 1020 can be located on the side or on the ground near the building 1010 and the exhaust structure 1030 can be located on the side of the building 1010. Further, the chilling unit 1000 can be installed on top of the building 1010, as illustrated in FIG. 10B. Other implementations are also possible.

Figure 11:
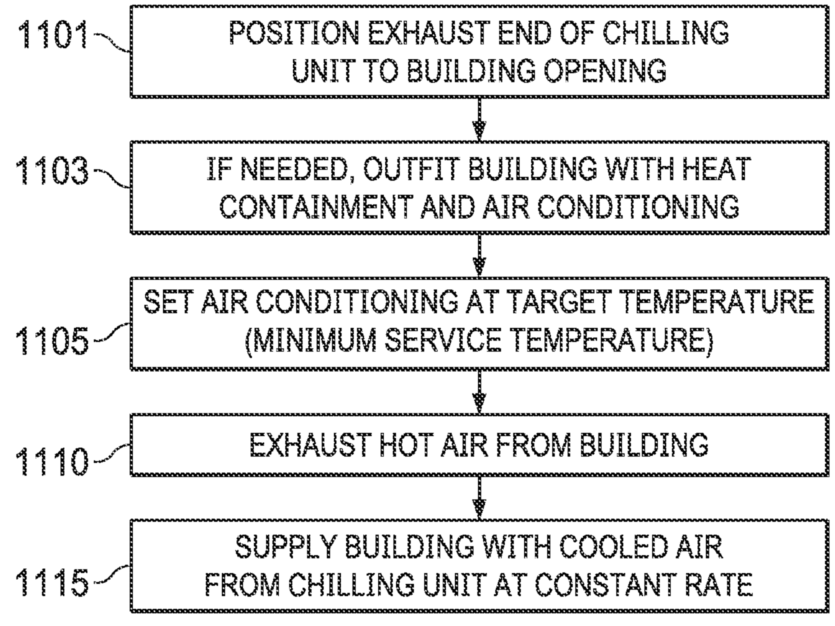
FIG. 11 is a flow chart illustrating an example of a method of removing heat from and cooling air in a building according to some embodiments.

Accordingly, referring to FIG. 11, in some embodiments, a method of removing heat from and cooling air in a building can include installing or positioning an exhaust end of a chilling unit to an opening formed on a wall or roof of the building (1101). If needed, the building can be outfitted with a heat containment and/or an AC unit, if the building does not already have a heat containment and/or an AC unit (1103). The heat containment can be structured to confine and/or direct heat produced inside the building to a vent, exhaust structure, or opening (e.g., a pipe) of the building, as described above. The AC unit can be an existing HVAC unit of the building or any commercially available AC unit. The AC unit is set to maintain a target temperature (e.g., the minimum service temperature required by an owner or operator of the building) (1105). As the air inside the building becomes heated, it rises and is received or captured by the heat containment and is then expelled from the building (1110). Hot air being expelled from the building creates a pressure differential in which the pressure at the hot side of the building (where the heat containment is located) is lower than the cool side of the building. Accordingly, the method further comprises supplying the building with cooled air from the chilling unit at a constant rate (1115). The chilling unit supplies cooled air (which, in some embodiments, can be achieved with one or more fan(s) and/or similar device(s)) to the building at a constant rate because the one or more fan(s) and/or similar device(s) are set to operate at a constant speed. Thus, no controller is needed to vary the speed of the fan(s) and/or similar device (s) in the chilling unit and, consequently, no additional temperature sensors are needed. Instead, the AC unit acts as an external controller that will kick in and start cooling the air inside the building when the AC unit itself senses that the temperature inside the building is above the target temperature and that will stop running once the temperature inside the building is back down to or below the target temperature.

In some embodiments, the minimum requirement for the chilling unit is that the one or more fan(s) and/or similar device(s)) are set to operate at a constant speed, with or without filters. In some embodiments, the chilling unit can additionally include the evaporative cooler (e.g., the mister 420 and/or the evaporative cooling element (e.g., the mist cooling element 424). In some embodiments, the chilling unit can include one or more freezer coils and/or chiller(s). Other implementations may also be possible.

These, and other, aspects of the disclosure and various features and advantageous details thereof are explained more fully with reference to the exemplary, and therefore non-limiting, embodiments illustrated herein. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

Some embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It is also within the spirit and scope of the invention to implement in software programming or code the steps, operations, methods, routines or portions thereof described herein, where such software programming or code can be stored in a computer-readable medium and can be operated on by a processor to permit a computer to perform any of the steps, operations, methods, routines or portions thereof described herein. The invention may be implemented by using software programming or code in one or more control systems, by using application specific integrated circuits, programmable logic devices, field programmable gate arrays, optical, chemical, biological, quantum or nanoengineered systems, components and mechanisms, various types of sensors including temperature, humidity, and/or pressure sensors may be used. The functions of the invention can be achieved by various means including distributed, or networked systems, hardware components, and/or circuits. In another example, communication or transfer (or otherwise moving from one place to another) of data may be wired, wireless, or by any other means.

A "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory. Such computer-readable medium shall be machine readable and include software programming or code that can be human readable (e.g., source code) or machine readable (e.g., object code). Examples of non-transitory computer-readable media can include random access memories, read-only memories, hard drives, data cartridges, magnetic tapes, floppy diskettes, flash memory drives, optical data storage devices, compact-disc read-only memories, and other appropriate computer memories and data storage devices. In an illustrative embodiment, some or all of the software components may reside on a single server computer or on any combination of separate server computers. As one skilled in the art can appreciate, a computer program product implementing an embodiment disclosed herein may comprise one or more non-transitory computer readable media storing computer instructions translatable by one or more processors in a computing environment.

A "processor" includes any hardware system, mechanism or component that processes data, signals or other information. A processor can include a system with a central processing unit, multiple processing units, dedicated circuitry for achieving functionality, or other systems. Processing need not be limited to a geographic location or have temporal limitations. For example, a processor can perform its functions in "real-time," "offline," in a "batch mode," etc. Portions of processing can be performed at different times and at different locations, by different (or the same) processing systems.

Those skilled in the art will appreciate that a suitable control system can include a central processing unit ("CPU"), at least one read-only memory ("ROM"), at least one random access memory ("RAM"), at least one hard drive ("HD"), and one or more input/output ("I/O") device (s). The I/O devices can include a keyboard, monitor, printer, electronic pointing device (for example, mouse, trackball, stylus, touch pad, etc.), or the like. In embodiments of the invention, the control system can have access to at least one database over a network connection.

ROM, RAM, and HD are computer memories for storing computer-executable instructions executable by the CPU or capable of being compiled or interpreted to be executable by the CPU. Suitable computer-executable instructions may reside on a computer readable medium (e.g., ROM, RAM, and/or HD), hardware circuitry or the like, or any combination thereof. Within this disclosure, the term "computer readable medium" is not limited to ROM, RAM, and HD and can include any type of data storage medium that can be read by a processor. Examples of computer-readable storage media can include, but are not limited to, volatile and non-volatile computer memories and storage devices such as random access memories, read-only memories, hard drives, data cartridges, direct access storage device arrays, magnetic tapes, floppy diskettes, flash memory drives, optical data storage devices, compact-disc read-only memories, and other appropriate computer memories and data storage devices. Thus, a computer-readable medium may refer to a data cartridge, a data backup magnetic tape, a floppy diskette, a flash memory drive, an optical data storage drive, a CD-ROM, ROM, RAM, HD, or the like.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only to those elements but may include other elements not expressly listed or inherent to such process, product, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the accompanying appendices, a term preceded by "a" or "an" (and "the" when antecedent basis is "a" or "an") includes both singular and plural of such term, unless clearly indicated otherwise (i.e., that the reference "a" or "an"

clearly indicates only the singular or only the plural). Also, as used in the description herein and in the accompanying appendices, the meaning of "in" includes "in" and "on" unless the context clearly dictates otherwise.

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like.

Those skilled in the art of the invention will recognize that the disclosed embodiments have relevance to a wide variety of areas in addition to the specific examples described above. For example, although the examples above are described in the context of data centers, some embodiments disclosed herein can be adapted or otherwise implemented to work in other types of environments, circumstances, etc. In this context, the specification and figures are to be regarded in an illustrative rather than a restrictive sense, and all such modifications are intended to be included within the scope of this disclosure. Accordingly, the scope of the present disclosure should be determined by the following claims and their legal equivalents.

What is claimed is:

1. A system for removing heat from and cooling air in a building, the system comprising:

a modular chilling unit separate from the building for supplying cooled air to the building at a constant rate, the building having a heat containment for capturing or receiving hot air inside the building, the building further having an exhaust structure comprising one or more vents associated with one or more vent fans for expelling the hot air from the building, the chilling unit comprising:

a housing having an intake end and an exhaust end in communication with the heat containment, wherein the intake end is not in communication with hot air downstream of the heat containment;

at least one chilling element disposed between the intake end and the exhaust end to lower the temperature of the ambient air; and at least one fan positioned in the housing and set to operate at a constant speed to draw ambient air from the intake end of the housing, cool the ambient air by directing air through the at least one chilling element, and direct the cooled air to an opening of the building;

wherein the system is operated to create a desired pressure differential by selectively operating the one or more vent fans to expel the hot air from the building such that an air pressure at a hot side of the building is lower than an air pressure at a cool side of the building, wherein the desired pressure differential draws the cooled air supplied by the chilling unit through the opening of the building from the hot side of the building to the cool side of the building; and wherein the building has an air conditioning unit that is set to maintain a target temperature and, responsive to a temperature in the building rising above the target temperature and with the chilling unit supplying the cooled air to the building at the constant rate, the air conditioning unit is operable to run until the temperature in the building drops down at or below the target temperature.

2. The system of claim 1, wherein the building comprises a data center.

3. The system of claim 2, wherein the target temperature is a minimum service temperature required by the data center.

4. The system of claim 2, wherein the heat containment comprises a server pod enclosing one or more banks of servers, the server pod having openings for drawing in the cooled air and a vent for directing air heated by the one or more banks of servers to the exhaust structure.

5. The system of claim 4, wherein the heat containment further comprises a sealed hood, enclosure, ductwork, or pipe.

6. The system of claim 1, wherein the constant rate is defined at least in part by the constant speed.

7. The system of claim 1, wherein the chilling unit further comprises at least a filter, an evaporative cooler, an evaporative cooling element, a freezer coil, or a chiller.

8. The system of claim 1, wherein the at least one fan comprises a fixed speed fan or a variable speed fan.

9. The system of claim 1, wherein the opening is formed in a wall, roof, or ceiling of the building.

10. The system of claim 1, wherein the air conditioning unit comprises a heating, ventilation, air conditioning (HVAC) system.

11. A method for removing heat from and cooling air in a building, the method comprising:

positioning an exhaust end of a modular chilling unit in an opening of the building, the modular chilling unit separate from the building, the chilling unit having:

a housing having an intake end and the exhaust end in communication with a heat containment, wherein the intake end is not in communication with hot air downstream of the heat containment;

at least one chilling element disposed between the intake end and the exhaust end to lower the temperature of the ambient air; and at least one fan positioned in the housing and set to operate at a constant speed to draw ambient air from the intake end of the housing, cool the ambient air by directing air through the at least one chilling element, and direct the cooled air to the opening of the building;

capturing or receiving hot air inside the building through the heat containment inside the building;

setting an air conditioning unit inside the building to maintain a target temperature; and expelling the hot air from the building through an exhaust structure of the building, the exhaust structure comprising one or more vents associated with one or more vent fans;

operating the exhaust structure to create a desired pressure differential by selectively operating the one or more vent fans to expel the hot air from the building such that an air pressure at a hot side of the building is lower than an air pressure at a cool side of the building, wherein the desired pressure differential draws the cooled air supplied by the chilling unit through the opening of the building from the hot side of the building to the cool side of the building; and wherein, responsive to a temperature in the building rising above the target temperature and with the chilling unit supplying the cooled air to the building at a constant rate, the air conditioning unit is operable to run until the temperature in the building drops down at or below the target temperature.

12. The method according to claim 11, wherein the building comprises a data center.

13. The method according to claim 12, wherein the target temperature is a minimum service temperature required by the data center.

14. The method according to claim 12, wherein the heat containment comprises a server pod enclosing one or more banks of servers, the server pod having openings for drawing in the cooled air and a vent for directing air heated by the one or more banks of servers to the exhaust structure.

15. The method according to claim 14, wherein the heat containment further comprises a sealed hood, enclosure, ductwork, or pipe.

16. The method according to claim 11, wherein the constant rate is defined at least in part by the constant speed.

17. The method according to claim 11, wherein the chilling unit further comprises at least a filter, an evaporative cooler, an evaporative cooling element, a freezer coil, or a chiller.

18. The method according to claim 11, wherein the at least one fan comprises a fixed speed fan or a variable speed fan.

19. The method according to claim 11, wherein the opening is formed in a wall, roof, or ceiling of the building.

20. The method according to claim 11, wherein the air conditioning unit comprises a heating, ventilation, air conditioning (HVAC) system.

* * * * *